United States Patent [19]

Villa

[11] Patent Number: 5,282,161
[45] Date of Patent: Jan. 25, 1994

[54] EEPROM CELL HAVING A READ INTERFACE ISOLATED FROM THE WRITE/ERASE INTERFACE

[75] Inventor: Nuccio Villa, Roncello, Italy

[73] Assignee: SGS-Thomson Microelectronics s.r.l., Milan, Italy

[21] Appl. No.: 816,885

[22] Filed: Dec. 31, 1991

[30] Foreign Application Priority Data

Dec. 31, 1990 [EP] European Pat. Off. ......... 90830622.8

[51] Int. Cl.⁵ ...................... G11C 11/34; G11C 11/40
[52] U.S. Cl. .................................. 365/185; 257/314; 257/316; 257/318
[58] Field of Search ................ 365/185; 257/316, 317, 257/318, 320, 314

[56] References Cited

U.S. PATENT DOCUMENTS

| 4,611,309 | 9/1986 | Chuang et al. | 365/185 |
| 4,832,316 | 4/1989 | Riva | 365/185 |
| 4,935,790 | 6/1990 | Cappelletti et al. | |
| 4,982,377 | 1/1991 | Iwasa | 365/185 |

FOREIGN PATENT DOCUMENTS

| 0268315 | 5/1988 | European Pat. Off. | |
| 0272732 | 6/1988 | European Pat. Off. | |
| 0347148 | 12/1989 | European Pat. Off. | |
| 0153082 | 7/1991 | Japan | 365/185 |

Primary Examiner—Eugene R. LaRoche
Assistant Examiner—Son Dinh
Attorney, Agent, or Firm—Seed and Berry

[57] ABSTRACT

An EEPROM cell with a single level gate structure is structured over at least three distinct active areas of the semiconducting substrate over which extend portions of the single isolated gate structure of the cell. A read transistor of the cell is formed in a distinct active area which is substantially isolated from the active area of the select transistor, wherein the thin dielectric tunnel layer is formed. Therefore the interface toward the external logic circuitry represented by the read transistor and the interface toward the programming circuitry are substantially isolated from each other. The read transistor may be designated to function at voltage and current levels compatible with the operating levels of the logic circuitry without interfering with the programming of the cell, thus eliminating the need for level regenerating stages. A second complementary read transistor may be formed into a fourth distinct active area, suitably doped, thus providing a read interface structured as a normal CMOS inverter stage.

The ability of the read transistor to operate at standard CMOS levels, makes the EEPROM cell particularly suited for implementing multiplexing or programmable interconnection arrays in CMOS devices.

19 Claims, 5 Drawing Sheets

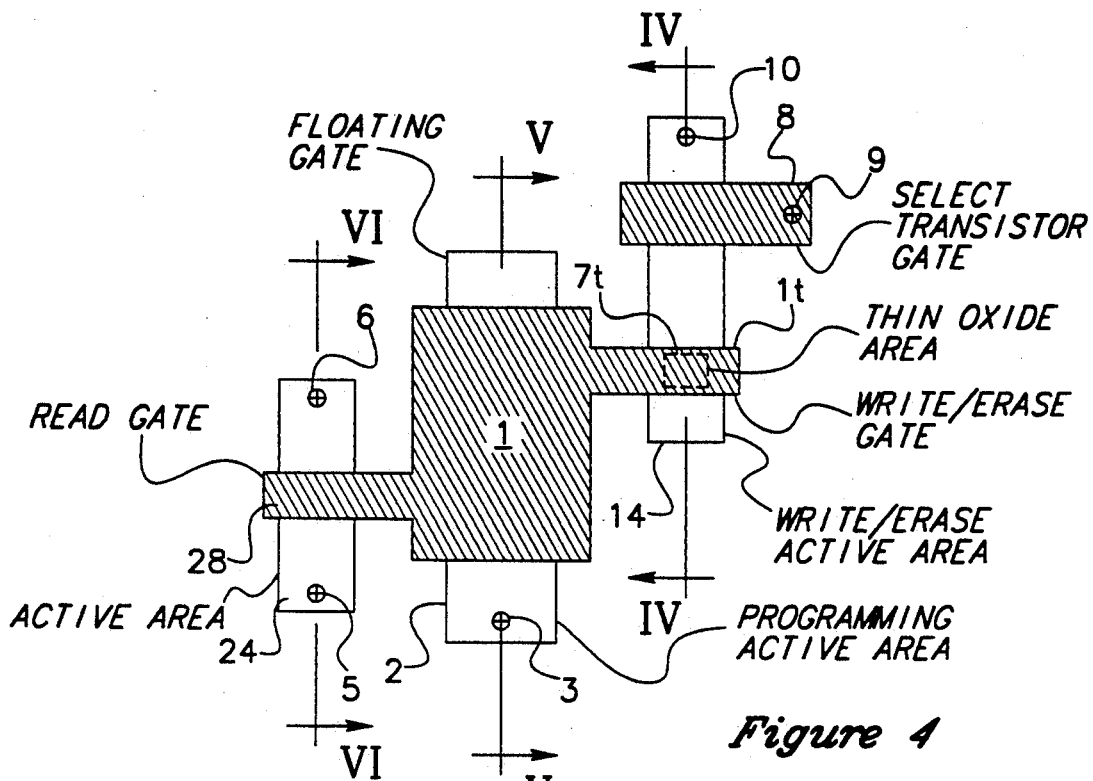
*Figure 4*
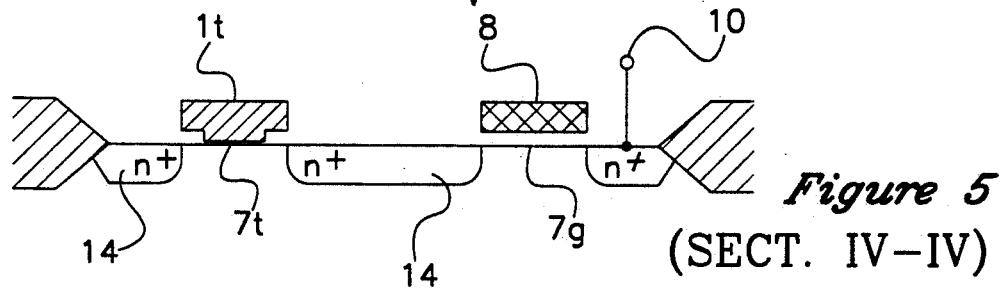
*Figure 5* (SECT. IV-IV)
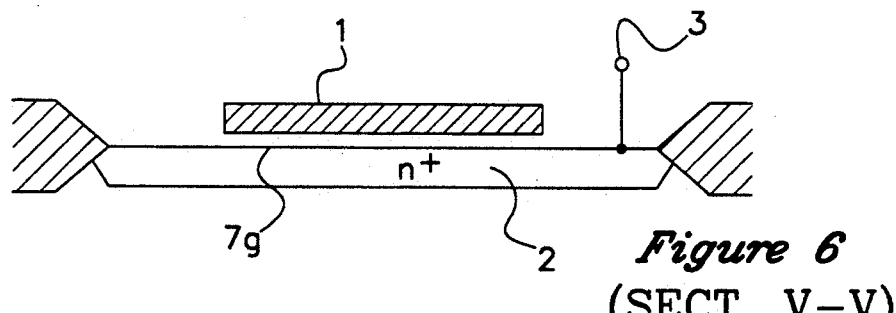
*Figure 6* (SECT. V-V)
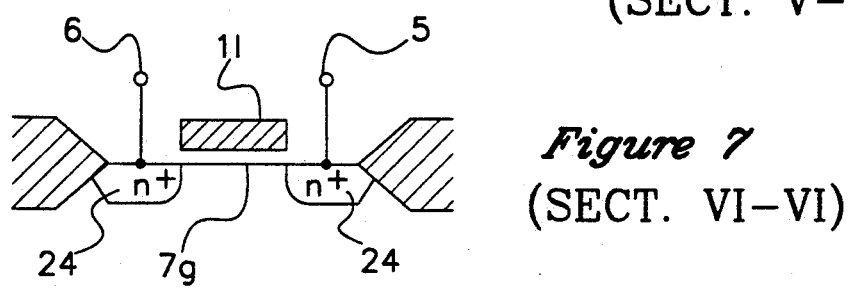
*Figure 7* (SECT. VI-VI)

EEPROM CELL HAVING A READ INTERFACE ISOLATED FROM THE WRITE/ERASE INTERFACE

TECHNICAL FIELD

The present invention relates to an EEPROM memory cell having an interface toward the programming circuitry which is substantially isolated electrically from other interfaces of the memory cell toward an external circuitry.

BACKGROUND OF THE INVENTION

The structure of an EEPROM memory cell with a single level of gate conductor, which is frequently constituted by a polycrystalline silicon layer (single poly) though it may also be constituted by an aluminum or aluminum alloy layer, may be schematically depicted as the structure of a MOS transistor, commonly an n-channel, isolated-gate transistor, wherein the control terminal is capacitively coupled to the isolated gate. The isolated gate is fundamentally and physically contoured over two zones: a thin tunnel-oxide zone, through which the basic electrical phenomena of the writing and erasing mechanisms of the memory cell occur, and a relatively thicker oxide zone, over which the isolated gate acts as the gate of a "read" transistor for reading the state or the data stored in the memory cell.

This typical structure of the known art, is depicted schematically in FIGS. 1, 2 and 3. See, for example, U.S. Pat. No. 4,935,790 incorporated herein by reference. The isolated gate 1 lies over a programming first active area 2 of the semiconducting substrate in order to form a capacitive coupling zone between the same isolated gate 1 and a control terminal 3. The isolated gate 1 has a first projection 1t and a second projection 1l, both extending over a second active area 4. In this second active area, the relative diffusions for creating a "read", n-channel, MOS transistor are formed, the drain terminal (contact) of which being indicated with 5 and the source region with 6 in the figure. Also in this second active area 4 the capacitive coupling between the isolated gate structure with a zone 7 of the semiconducting substrate which is covered with a thin, dielectric, tunnelling layer, essentially thinner than the dielectric gate layer which is present over the rest of the area 4, is realized. Moreover, as shown in FIGS. 1 and 2, within the same second active area 4, an n-channel select transistor is also commonly formed, the gate of which is indicated with 8 and the relative control terminal with 9 (FIG. 1) and whose source terminal is indicated with 10.

The fact that the gate 1l of the "read" transistor is formed on the same active area 4 over which the writing/erasing gate 1t is also formed, creates precise limitations and nonnegligible drawbacks. In these known cells, relatively low voltages must be maintained across the "read" gate of the cell, i.e. between the source and the drain regions (6 and 5) of the read transistor of the cell, in order to prevent an unintentional modification of the programmed or erased state of the memory cell. In fact, by being the read transistor's gate 1l formed within the same active area 4 of the write/erase tunnelling zone 7, any voltage across these regions is replicated in the write/erase gate zone and this voltage determines an electric field across the tunneling thin dielectric layer 7 given by:

$$\frac{V_{isolated\ gate} - V_{drain\ of\ the\ write\ gate}}{\text{thickness of the tunnel dielectric}} = \frac{V(1) - V(6)}{\text{thickness (7)}}$$

If not appropriately limited, this electric field may determine a reverse voltage value sufficient to program an erased cell or to erase a programmed cell, thus causing erroneous responses of the memory device.

These restraints on the voltage levels which may be safely used in reading the data stored in the memory cell, i.e. of the voltage levels which may be used at the interface of the memory cell toward the external circuitry, disadvantageously limit the use of the memory cell as a modular element capable of being coupled directly with other CMOS structures of the circuitry outside the memory section of the integrated circuit. On the contrary, this makes necessary to operate with relatively small amplitude signals and to add signal level regenerating stages "downstream" of the EEPROM cells, thus increasing the signal propagation times and the power consumption of the integrated circuit.

SUMMARY OF THE INVENTION

In view of this state of the art, the present invention provides an EEPROM cell with a single level of gate conductor, having an interface coupled to the programming circuitry which is electrically isolated from other interfaces of the cell coupled to an external circuitry. In this way the implementation of a logic function by operating the cell or the cells at voltage and current levels of normal CMOS circuitry may be realized through the same isolated gate of the memory cell.

Basically, the EEPROM cell of the invention comprises an isolated gate structure which is formed by a first portion which extends over a first active area of a semiconducting substrate covered by a gate dielectric layer, and which is capacitively coupled to a selected control terminal of the cell. The isolated gate structure includes a second portion which extends over a second active area that is substantially isolated from the first active area. The second active area is covered with a tunnelling dielectric layer which is thinner than the dielectric gate layer in a region underneath the second portion of the isolated gate. The isolated gate has at least a third portion which extends over a third active area that is substantially isolated from the first and the second active areas and which is covered with a dielectric gate layer and constitutes the gate of at least a first "read" transistor of the state of the memory cell.

Alternatively, the same isolated gate of the memory cell may have a further projection extending over a fourth active area having a type of conductivity complementary to the type of conductivity of the other three active areas mentioned before, in order to form a second "read" transistor of the state of the memory cell of a complementary type in respect to the first read transistor. This latter embodiment, as will be discussed later, provides an interface which is advantageously configured as a CMOS inverter and permits to implement an important enabling and reset logic function in an extremely simple and effective manner by employing a single memory cell, with remarkable advantages in terms of speed of propagation and of area occupation.

In a further alternative embodiment, two or more extensions of the isolated gate may be formed over the same active area for creating two or more read transistors respectively, isolated from the programming circuitry of the cell.

The different aspects and advantages of the invention will become evident through the following detailed description of some preferred embodiments of the invention and by reference to the drawings.

BRIEF DESCRIPTION OF THE DRAWINGS

FIG. 4 is a schematic plan view of the integrated structure of an EEPROM memory cell with a single level of gate conductor, made in accordance with the present invention;

FIG. 5 is a simplified cross sectional view of the structure of FIG. 4 on the sectional plane IV—IV;

FIG. 6 is a simplified cross sectional view of the integrated structure of FIG. 4, on the sectional plane V—V;

FIG. 7 is a simplified cross sectional view of the integrated structure of FIG. 4, on the sectional plane VI—VI;

DETAILED DESCRIPTION OF THE INVENTION

Figure 1:
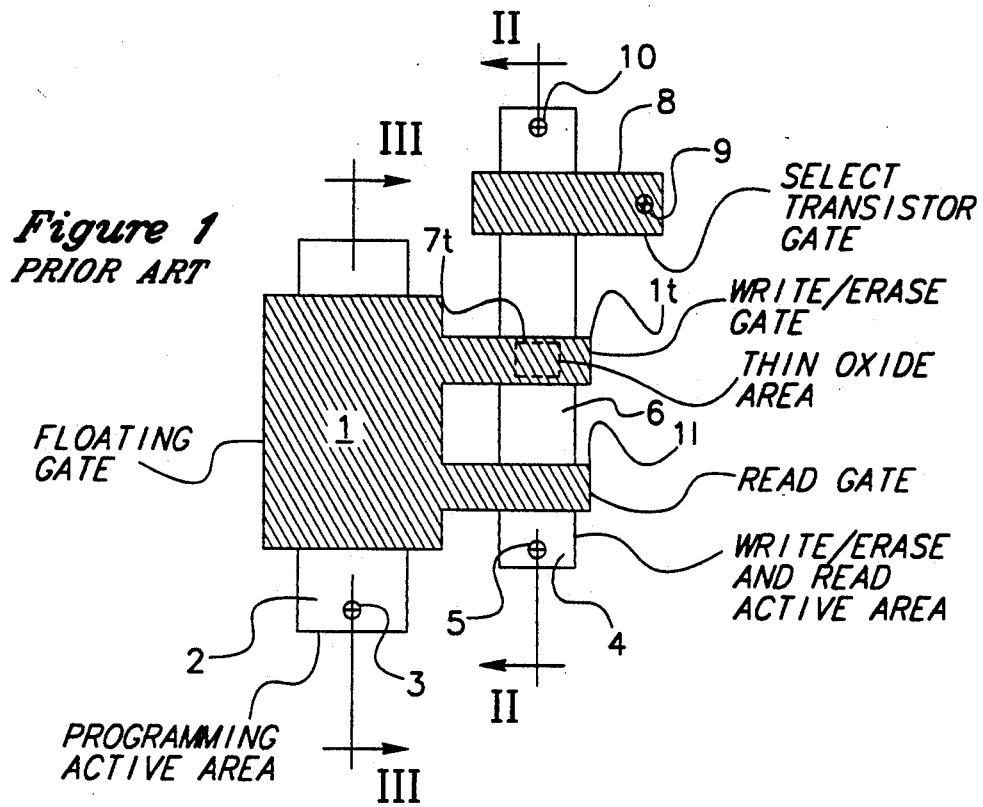
FIG. 1 is a schematic plan view of the structure of an EEPROM cell, according to the prior art.
Figure 2:
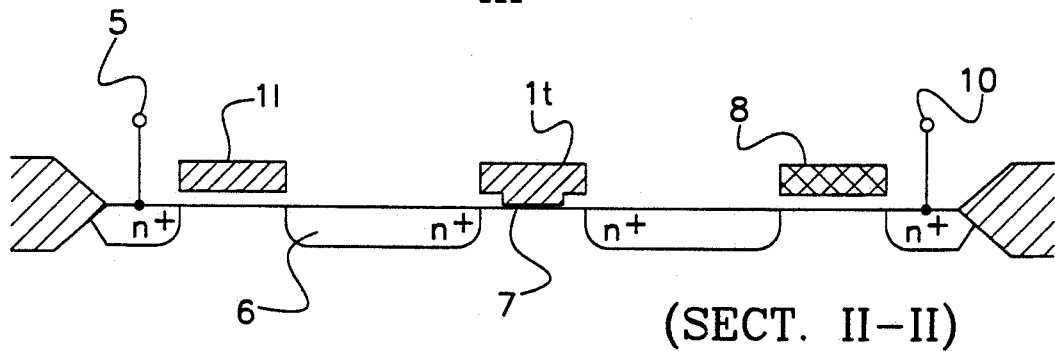
FIG. 2 is a simplified view in cross section of the structure of FIG. 1, on the section plane II—II.
Figure 3:
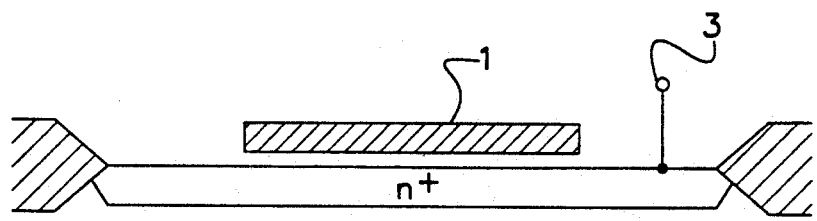
FIG. 3 is a simplified cross sectional view of the integrated structure of FIG. 1, on the section plane III—III.

With reference to FIGS. 4, 5, 6 and 7, the isolated gate has a projection 28 constituting a so-called "read gate" of the memory device, which does not extend over the same active area 14, as was the case in the structure of an EEPROM cell of the prior art, but on the contrary the read gate 28 extends over a third active area 24, within which respective source and drain regions are formed in the underlying semiconducting substrate and which are contacted through the contacts 5 and 6, respectively of drain and source. (In the FIGS. 4, 5, 6, 7 and 8, which depict two alternative embodiments of the EEPROM cell of the invention, the same numbers already used in the preceding FIG. 1, 2 and 3 have been used for indicating similar or functionally equivalent parts of the integrated structures, with the purpose of facilitating a comparison among the different features of the cell of the invention and the features of a known cell, which has been already described in the preceding background section of the present specification.) The write/erase region, belonging to the active area 14, within which also the "select" transistor is formed in a manner similar to that of an EEPROM cell of the prior art, is distinctly separated from the region of the read transistor which is made within the active area 24 and the gate structure of which may be designed in a manner completely free of restraints which would be otherwise imposed by the programming circuitry which advantageously interfaces with the active area 14, and thus may function at voltage and current levels compatible with those of a normal CMOS external circuitry. In fact the capacitive coupling of the isolated gate toward the external circuitry is dramatically reduced for what concerns the tunnelling zone 7t where the thin dielectric layer 7 is present and where the previously mentioned problems may occur. The tunnelling zone is within the active area 14, which represents the interface region with the programming circuitry of the memory cell.

The active area 24 represents instead the interface region between the cell and the external circuits and, in practice, is substantially isolated electrically toward the other programming circuitry interface region. In fact even though, through the gate structure of the read transistor, a capacitive coupling with the zone 7t of the write/erase thin dielectric layer exists through the same isolated gate 1, this coupling occurs through a dielectric layer having a thickness from three to four times greater then the thickness of the thin dielectric layer 7 which is present in the tunnelling area 7t and therefore the electric field intensity is reduced by a similar factor for the same biasing voltage and may be neglected. In any case, the choice of the most suitable biasing voltage for the control terminal 3 remains possible in order to balance the coupling with the gate of the read transistor and thus preserve the electric state of the memory cell, during a reading phase.

One particularly advantageous aspect of the structure of the EEPROM memory cell of the present invention is represented by the possibility of differentiating the electrical characteristics of the read transistor of the cell according to need, as well as by the possibility of realizing more than one read transistor, each having electrical characteristics different from the others. Among these alternative embodiments, a particularly preferred embodiment is the one shown in FIG. 8. According to this embodiment, the isolated gate is provided with another projection 30 extending over a fourth active area 12 which has been provided with a conductivity of opposite type in respect to the type of conductivity of the active area 24. By forming the respective source and drain diffusions, two distinct and complementary read transistors: of the memory cell are formed one with an n-channel and the other with a p-channel. By connecting the respective terminals of the pair of complementary transistors in the manner shown in FIG. 8, a "read interface" toward the external circuitry is obtained, which is substantially configured as a CMOS inverter. This type of read interface lends itself to very convenient circuital applications, as will be described later.

Under more general terms, the EEPROM memory cell of the invention lends itself to an extraordinarily large number of applications, as will be evident to a skilled person.

APPLICATION 1

Figure 9:
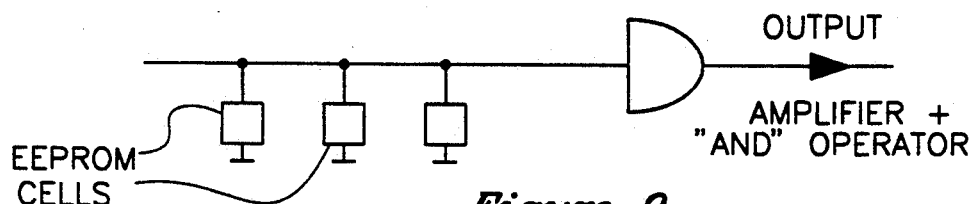
FIG. 9 is a functional block diagram of a logic circuit for generating a product term by employing EEPROM cells, according to a prior known technique.

A logic function which is often implemented in integrated devices is the generation of a product term by employing individually addressable and programmable EEPROM cells organized in an array of rows and columns and analog circuits (sense amplifiers) with the function of amplifying the weak read signals of the EEPROM cells which have an amplitude in the order of ten millivolts, coming from the array. These integrated architectures, though being quite compact from the point of view of silicon area occupation, denounce a large power consumption and a remarkable delay in the regeneration to CMOS logic levels of the read signals derived from the array of EEPROM cells. FIG. 9 shows a functional block diagram of such a circuit.

Figure 10:
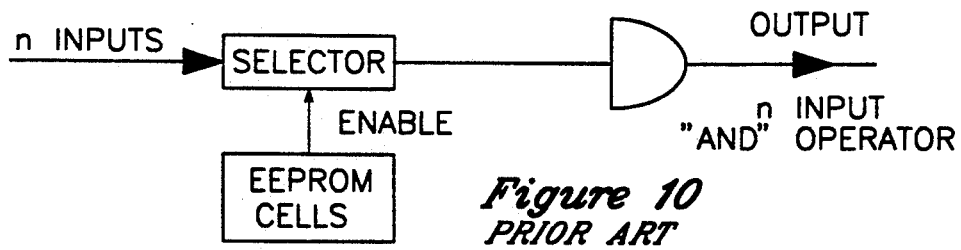
FIG. 10 is a block diagram of a logic circuit functionally equivalent to the circuit of FIG. 9, realized in CMOS technology, in accordance with the prior art.

In FIG. 10 is shown a block diagram relative to a sample implementation of the functions of the circuit of FIG. 9 in a CMOS type device. The parts which are pertinent to the function of enabling the selector may be generically made by employing conventional type EEPROM cells according to various circuital arrangements which are well known to a skilled technician, among which the most typical arrangement is a voltage divider using two EEPROM cells, as depicted in FIG. 11 which also contains the relative logic operation table.

Figure 11:
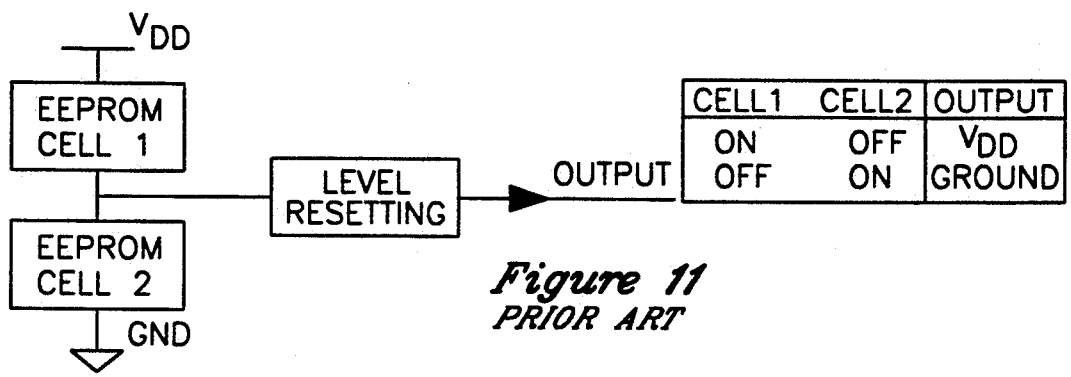
FIG. 11 is a partial block diagram of the enable circuit section of the functional diagram of FIG. 10, realized by using EEPROM cells having a conventional structure, in accordance with a known technique.

In a CMOS device, an embodiment of the type shown in FIG. 11, using two n-channel EEPROM cells, has the drawback of producing an output high level of a lower value than the supply voltage and more precisely lower by a threshold value then the voltage which is present on the isolated gate of the memory cell 1, i.e.:

$$V_{output} = V_{(gate\ of\ cell\ 1)} - V_{threshold}.$$

This voltage divider structure is extremely critical because the output signal may be degenerated and insufficient to drive CMOS circuits downstream. It is therefore necessary to add, downstream of the divider, a level regenerating stage in order to reduce this criticality. These restraints impose severe limits on programming quality and may cause a remarkable decrease of the fabrication yield. Moreover for each enable signal, two EEPROM cells and a relative level regenerating stage for the voltage signal are needed, i.e. in practice a "redundant" circuit stage as compared to strict functional needs.

Figure 8:
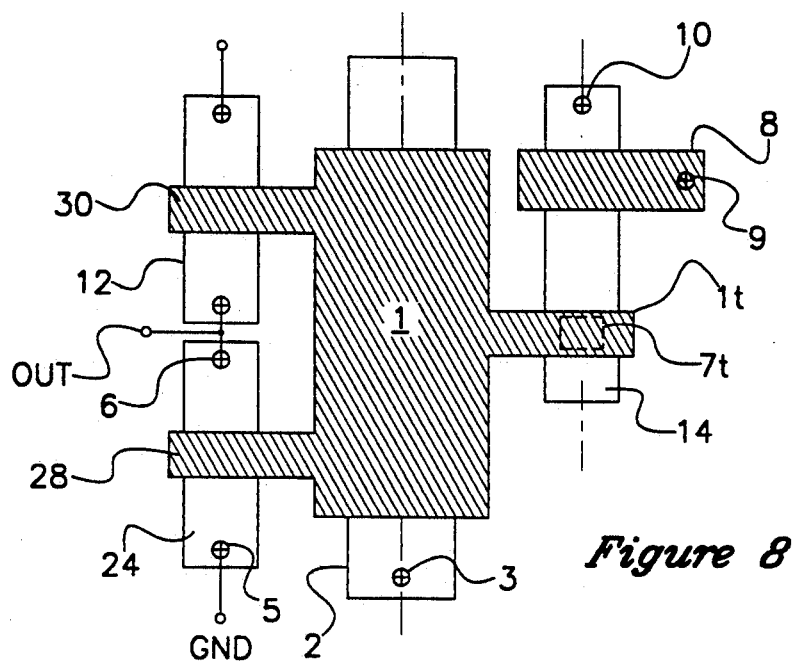
FIG. 8 is a schematic plan view of an alternative embodiment of the integrated structure of an EEPROM memory cell of the invention.

By employing a single EEPROM memory cell of the invention, of the type depicted in FIG. 8, the memory function and the auxiliary function of regenerating the voltage level of the logic signal may be implemented in a combined manner. In fact the OUT terminal of the EEPROM cell of the invention described in FIG. 8, may represent the output terminal of the functional scheme of FIG. 11, while the respective source terminal of the p-channel read transistor may be directly connected to the supply rail $V_{DD}$ and the source terminal 5 of the n-channel read transistor may be connected to ground (GDN).

By suitably dimensioning the CMOS inverter constituted by the pair of complementary read transistors of the EEPROM cell (naturally provided with two read gates: 28 and 30) the required functions are practically implemented.

Figure 12:
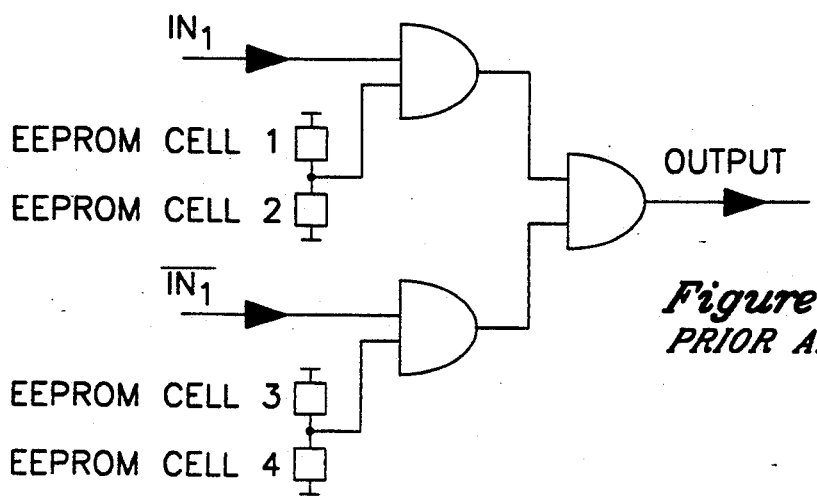
FIG. 12 is a further functional block diagram showing in greater detail the portion for the generation of the enable and selection signals for a single input of the circuit of FIG. 10.

FIG. 12 shows in greater detail the circuit portion for the generation of the enable and selection signals for a single input of the circuit of FIG. 10. Of course this structure is replicated as many times as the number of inputs.

Figure 13:
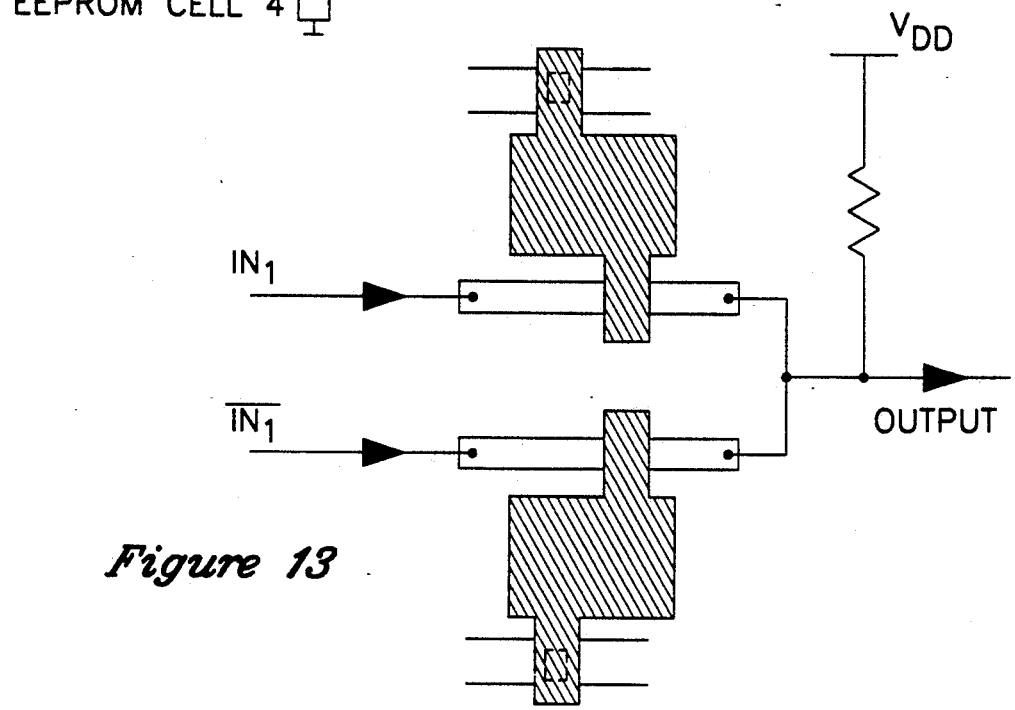
FIG. 13 is a circuit diagram, functionally equivalent to the circuit of FIG. 12, realized by using EEPROM cells made in accordance with the present invention, in the form depicted in FIG. 8.

The same functions are implemented by using only two EEPROM cells of the invention, of the type shown in FIG. 4, for driving through the respective output terminal (OUTPUT) of the memory cell a circuit which implements the logic AND operator, according to the diagram shown in FIG. 13.

By using the EEPROM cells of the invention, a redundancy in the total number of cells may be eliminated (two cells instead of four), thus realizing a remarkable saving of occupied area (two transistors instead of twelve, as would be necessary according to the diagram of FIG. 12, as will be evident to a skilled technician) and there will be a propagation delay imputable to a single transmission gate instead of the sum of propagation delays of two logic AND gates.

APPLICATION 2

Figure 14:
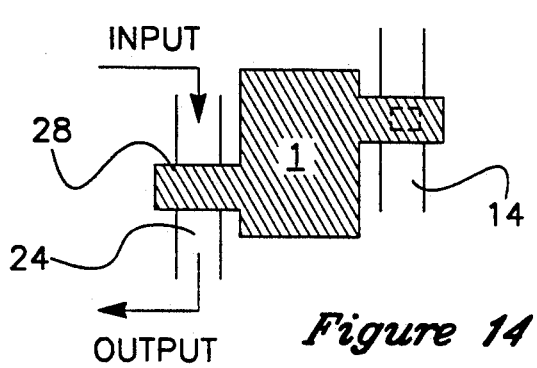
FIG. 14 is a functional, schematic plan view of the integrated structure of an EEPROM cell of the invention.
Figure 15:
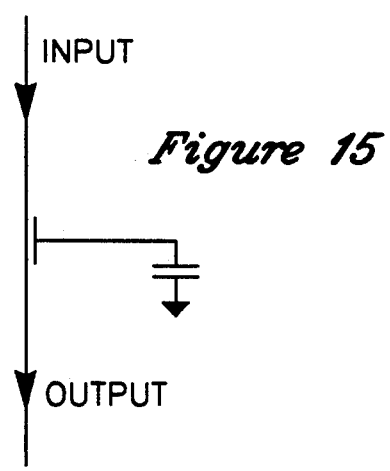
FIG. 15 represents an equivalent circuit diagram of the integrated structure of FIG. 14.
Figure 16:
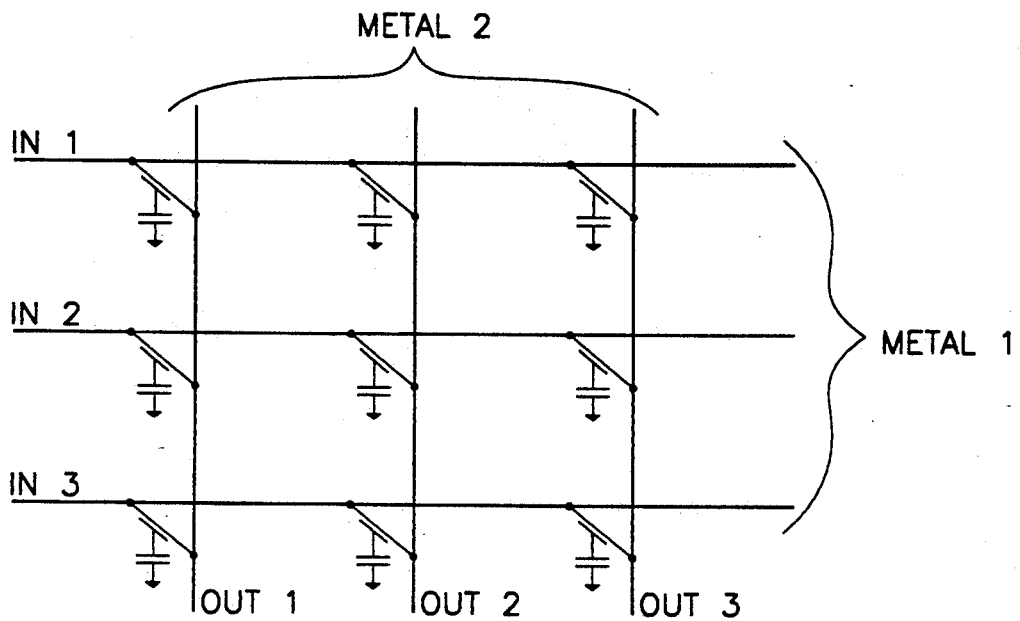
FIG. 16 is a schematic representation of the functional diagram of a multiplexing array, i.e. of a programmable interconnection array made with EEPROM cells of the present invention.

A single EEPROM cell made in accordance with the present invention may be functionally represented in a schematic way by the simplified integrated structure depicted in FIG. 14. To this structure corresponds the functional electric circuit shown in FIG. 15. The EEPROM cell of the invention is particularly suited to act as an EEPROM interconnecting element within complex programmable integrated devices. The cell is in fact capable of simultaneously perform a memory function and the function of a switch, the latter being perfectly suited to operate with voltage levels which are compatible with a standard CMOS circuitry. Therefore the EEPROM cell of the invention possesses an outstanding utility for implementing multiplexing structures or programmable interconnection arrays. A functional scheme of such an array of EEPROM cells of the invention is depicted in FIG. 16. A programmable interconnection array may be schemed in a first order of parallel conducting lines, patterned through a first level metal layer (metal 1), each corresponding to a respective input of the array and in a second order of parallel conducting lines, electrically isolated from the conducting lines of the first order, orthogonally arranged over the conducting lines of the first order, commonly patterned through a second level metal layer (metal 2), each corresponding to a respective output of the array. (Of course, metal 1 and/or metal 2 could be polycrystal layers in some embodiments.) At every crossing between a conducting line of the first order (input line) and a conducting line of the second order (output line) there is a programmable connection device, which is advantageously constituted by an EEPROM cell of the invention. The connection element is constituted by the read transistor of the state of the programmable memory cell, the source and drain terminals of which are respectively connected to a conducting line of the first order (to an input) and to a conducting line of the second order (to an output), or vice versa. As already described before, this read transistor of the EEPROM cell made in accordance with the present invention may advantageously be sized so as to withstand voltage and current levels which are compatible with the levels of a logic circuit external to the interconnection array, by being substantially isolated from the programming active area of the memory cell.

Figure 17:
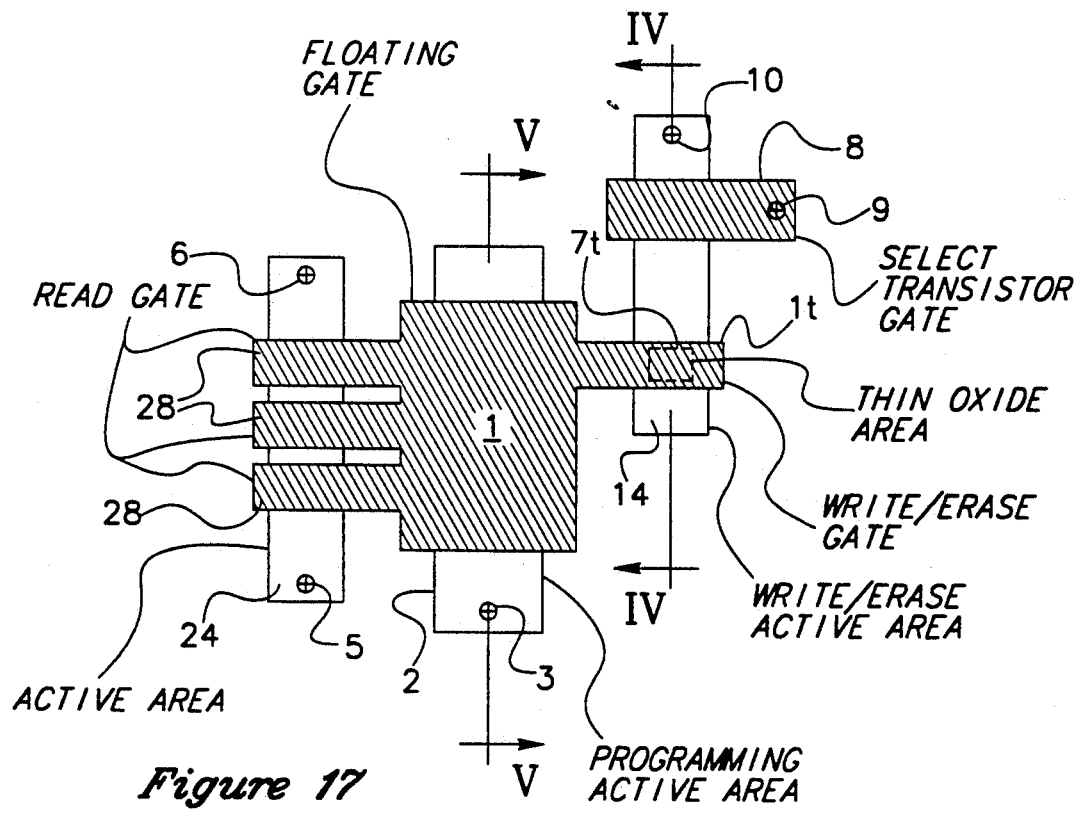
FIG. 17 is a schematic plan view of an alternate embodiment of the integrated structure of an EEPROM memory cell with a single level of gate conductor, made in accordance with the present invention.

As a further alternative embodiment shown in FIG. 17, the structure of FIGS. 4 or 14 is modified to have two or more portions 28 of the gate layer 1 extend over the read active area 24 rather than just the single portion 28 shown in FIGS. 4 and 14. This permits two or more read transistors to be formed and programmed from a single isolated gate structure 1.

What is claimed is:

1. An EEPROM memory cell with a single level gate structure, comprising an isolated gate of conducting material having a first portion extending over a first active area of a semiconducting substrate covered with a dielectric gate layer, for establishing a capacitive coupling with a control terminal of the cell, a second portion extending over a second active area, isolated from said first active area and covered over at least a portion of the area underneath said second portion of the isolated gate with a dielectric tunnel layer essentially thinner than said dielectric gate layer, characterized by the fact that said isolated gate has at least a third portion which extends over at least a first portion of a third active area covered with a dielectric gate layer and which is isolated from said first active area and from said second active area, said third portion of the isolated gate constituting the gate of at least a first read transistor of the memory cell.

2. The EEPROM cell according to claim 1, wherein said isolated gate has a fourth portion which extends over a fourth active area covered with a dielectric gate layer and which is isolated from said other active areas and said fourth portion constitutes the gate of a second read transistor of the memory cell, complementary to said first read transistor.

3. The EEPROM cell according to claim 1, wherein within said second active area and over a portion of said second active area which is covered with a dielectric gate layer, extends a gate of a select transistor of the cell.

4. A logic circuit formed on a semiconducting substrate and employing EEPROM memory cells with a single level gate structure, organized in an array of rows and columns of cells, which are individually addressable and programmable, characterized by the fact that each EEPROM memory cell is structured over at least three distinct active areas of said semiconducting substrate and over which areas extend portions of a single isolated gate of the cell;

the active area over which extends a portion of said isolated gate which constitutes the gate of a read transistor of the EEPROM cell, representing an interface zone with an external circuitry, which is substantially isolated from an interface zone with a select and programming circuitry of the cell which is represented by another of said distinct active areas;

said read transistor of the cell being capable of operating with voltage and current levels which are compatible with the operating voltage and current levels of said external circuitry.

5. A programmable interconnection array comprising a first order of parallel conducting lines, each being connected to a respective input of the array, and a second order of parallel conducting lines, electrically isolated from the conducting lines of said first order, orthogonally arranged over said conducting lines of the first order and each line of the second order being connected to a respective output of the array and programmable electrical connection means between each line of said first order and each line of said second order at every crossing between each line of the first order and each line of the second order, characterized by the fact that each of said programmable electrical interconnection means is constituted by an EEPROM cell with a single level gate structure, having an isolated gate, a first portion of which extends over a first active area of a semiconducting substrate covered with a dielectric gate layer, for establishing a capacitive coupling with a control terminal of the cell, a second portion of which extends over a second active area, isolated from said first active area and covered over at least a first portion of area underlying said second portion of the isolated gate with a dielectric tunnel layer which is essentially thinner than said dielectric gate layer and a third portion of which extends over a third active area covered with a dielectric gate layer and isolated from said first active area and from said second active area and constituting the gate of at least a first read transistor of the memory cell, the source and drain terminal of which area respectively connected to a conducting line of the first order and to a conducting line of the second order;

said read transistor of the cell being capable of operating as a switch, in function of the programmed state of the cell, at voltage and current levels which are compatible with the operating levels of a logic circuit, by being substantially isolated from said second active area of the cell covered with said dielectric tunnel layer.

6. An EEPROM memory cell with a single level gate structure, comprising:

a semiconductor substrate;

a first active area within said semiconductor substrate;

a second active area within said semiconductor substrate, said second active area being physically separated from said first active area;

a third active area within said semiconductor substrate, said third active area being physically separated and isolated from said second active area;

a dielectric gate layer overlying said first active area;

a dielectric gate area overlying said second active area, at least a portion of said second dielectric including a thinner region than other regions of said dielectric layer to provide a thin tunnelling layer;

a dielectric layer formed over said third active area; and an isolated gate electrode including a first portion extending over said first active area and separated from the first active area by said dielectric gate layer, a second portion extending over said second active area and over at least a portion of said thin tunnelling layer, and a third portion extending over said third active area and being separated from said third active area by said dielectric layer, said second portion forming a write/erase gate of said EEPROM memory cell and said third portion forming a read gate of said EEPROM memory cell with said write/erase gate and said read gate extending over separate, isolated active areas in said substrate.

7. The EEPROM memory cell according to claim 6 wherein said first active area is positioned in said substrate between said second active area and said third active area such that said second active area and said third active area are on either side of said first active area and separated from each other by said first active area.

8. The EEPROM memory cell according to claim 6, further including:
a fourth active area formed in said substrate isolated from each of said first, second and third active areas, said fourth active area having the opposite conductivity type of doping than said third active area; and
a fourth portion of said isolated gate structure extending over said fourth active area and separated from said fourth active area by a dielectric layer.

9. The EEPROM according to claim 8, further including:
an electrical connection between said third active area and said fourth active area to electrically connect said third and fourth active areas together to form a common electrical node to provide an output signal, said isolated gate structure forming a CMOS inverter.

10. The EEPROM memory cell according to claim 8, further including:
a fifth portion and a sixth portion extending from said isolated gate structure over said third active area forming additional read transistors of said EEPROM memory cell over a common active area with said first read gate.

11. An EEPROM memory cell with a single level gate structure, comprising:
a semiconductor substrate;
a first active area within said semiconductor substrate;
a second active area within said semiconductor substrate, said second active area being physically separated from said first active area;
a third active area within said semiconductor substrate, said third active area being physically separated and isolated from said second active area;
a first dielectric layer overlying said first active area;
a second dielectric layer overlying said second active area, at least a portion of said second dielectric layer including a thinner region than other regions of said dielectric layer to provide a thin tunnelling layer;
a third dielectric layer formed over said third active area;
an isolated gate electrode including a first portion extending over said first active area and separated from the first active area by said first dielectric layer, a second portion extending over said second active area and over at least a portion of said thin tunnelling layer, and a third portion extending over said third active area and being separated from said third active area by said third dielectric layer, said second portion forming a write/erase gate of said EEPROM memory cell and said third portion forming a read gate of said EEPROM memory cell with said write/erase gate and said read gate extending over separate, isolated active areas in said substrate;
a fourth active area formed in said substrate and isolated from each of said first, second and third active areas, said fourth active area having the opposite conductivity type of doping than said third active area; and
a fourth portion of said isolated gate structure extending over said fourth active area and separated from said fourth active area by a fourth dielectric layer.

12. The EEPROM memory cell according to claim 11 wherein said first active area is positioned in said substrate between said second active area and said third active area such that said second active area and said third active area are on either side of said first active area and separated from each other by said first active area.

13. The EEPROM according to claim 11, further including:
an electrical connection between said third active area and said fourth active area to electrically connect said third and fourth active areas together to form a common electrical node to provide an output signal, said isolated gate structure forming a CMOS inverter.

14. The EEPROM memory cell according to claim 11, further including:
a fifth portion and a sixth portion extending from said isolated gate structure over said third active area forming additional read transistors of said EEPROM memory cell over a common active area with said first read gate.

15. The EEPROM memory cell according to claim 11, wherein said first, second, and third dielectric layers comprise a unitary dielectric layer.

16. The programmable interconnection array according to claim 5 wherein said first active area is positioned in said substrate between said second active area and said third active area such that said second active area and said third active area are on either side of said first active area and separated from each other by said first active area.

17. The programmable interconnection array according to claim 5, further including:
a fourth active area formed in said substrate isolated from each of said first, second and third active areas, said fourth active area having the opposite conductivity type of doping than said third active area; and
a fourth portion of said isolated gate structure extending over said fourth active area and separated from said fourth active area by a dielectric layer.

18. The programmable interconnection array according to claim 17, further including:
an electrical connection between said third active area and said fourth active area to electrically connect said third and fourth active areas together to form a common electrical node to provide an output signal, said isolated gate structure forming a CMOS inverter.

19. The programmable interconnection array according to claim 17, further including:
a fifth portion and sixth portion extending from said isolated gate structure over said third active area forming additional read transistors of said EEPROM memory cell over a common active area with said first read gate.

* * * * *